United States Patent
Sala et al.

(10) Patent No.: US 11,466,508 B2
(45) Date of Patent: Oct. 11, 2022

(54) SPACER FOR PHOTOVOLTAIC APPLICATIONS

(71) Applicant: TECHNOFORM GLASS INSULATION HOLDING GMBH, Lohfelden (DE)

(72) Inventors: Paolo Sala, Lohfelden (DE); Petra Sommer, Lohfelden (DE)

(73) Assignee: TECHNOFORM GLASS INSULATION HOLDING GMBH, Lohfelden (DE)

( * ) Notice: Subject to any disclaimer, the term of this patent is extended or adjusted under 35 U.S.C. 154(b) by 252 days.

(21) Appl. No.: 16/759,180

(22) PCT Filed: Oct. 29, 2018

(86) PCT No.: PCT/EP2018/079585
§ 371 (c)(1),
(2) Date: Apr. 24, 2020

(87) PCT Pub. No.: WO2019/086384
PCT Pub. Date: May 9, 2019

(65) Prior Publication Data
US 2021/0159354 A1  May 27, 2021

(30) Foreign Application Priority Data
Oct. 30, 2017 (EP) .................. 17199279.5

(51) Int. Cl.
*E06B 3/663* (2006.01)
*H01L 31/02* (2006.01)
(Continued)

(52) U.S. Cl.
CPC ...... *E06B 3/66366* (2013.01); *E06B 3/66314* (2013.01); *E06B 3/66319* (2013.01);
(Continued)

(58) Field of Classification Search
CPC .. E06B 3/663; E06B 3/66304; E06B 3/66309; E06B 3/66314; E06B 3/66319;
(Continued)

(56) References Cited

U.S. PATENT DOCUMENTS 4,506,125 A * 3/1985 Smets ................ C03C 27/06
219/633
4,893,908 A 1/1990 Wolf et al.
(Continued)

FOREIGN PATENT DOCUMENTS

CA  2082440 A1  5/1993
CA  2416264 A1  1/2002
(Continued)

OTHER PUBLICATIONS

Notice of Allowance from the Russian Patent Office dated Mar. 3, 2022 in counterpart Russian application No. 2020116976/03(028317).
(Continued)

*Primary Examiner* — Kyle J. Walraed-Sullivan
(74) *Attorney, Agent, or Firm* — J-Tek Law PLLC; Jeffrey D. Tekanic; Scott T. Wakeman

(57) ABSTRACT

A spacer for a multi-pane insulating glazing unit includes a spacer body made from a first material with first and second hollow desiccant chambers extending in a longitudinal direction and a longitudinal groove between the first and second chambers open to a first side of the spacer for holding an intermediate pane of the glazing unit, the groove being delimited in a width direction by first and second side walls and having a bottom wall, and the spacer body having a gas barrier on a second side opposite the first side. The first side wall and/or the second side wall and/or the bottom wall of the groove include at least two electrically conductive portions electrically isolated from each other and configured
(Continued)

to make electrical contact with at least one electrical contact of the intermediate pane.

20 Claims, 11 Drawing Sheets

(51) Int. Cl.
  *H01L 31/048* (2014.01)
  *H01L 31/055* (2014.01)
(52) U.S. Cl.
  CPC ...... *E06B 3/66333* (2013.01); *E06B 3/66376* (2013.01); *H01L 31/02008* (2013.01); *H01L 31/0488* (2013.01); *H01L 31/055* (2013.01); *E06B 2003/66395* (2013.01)
(58) Field of Classification Search
  CPC .............. E06B 3/66328; E06B 3/66342; E06B 3/66347; E06B 3/66352; E06B 3/66357; E06B 3/66366; E06B 3/5429; E06B 3/5418; E06B 3/5454; E06B 3/66; E06B 3/6612; E06B 3/67304; E06B 3/67326; E06B 3/67334; E06B 3/6733; E06B 2003/6638; E06B 2003/66395; E06B 2003/5472; H01L 31/0488
  See application file for complete search history.

(56) References Cited

U.S. PATENT DOCUMENTS

| | | | |
|---|---|---|---|
| 4,958,917 A | | 9/1990 | Hashimoto et al. |
| 5,076,673 A | * | 12/1991 | Lynam .................... G02F 1/153 359/275 |
| 6,115,989 A | * | 9/2000 | Boone ................. E06B 3/66366 52/786.13 |
| 6,373,618 B1 | | 4/2002 | Agrawal et al. |
| 6,537,629 B1 | | 3/2003 | Ensinger |
| 2002/0075552 A1 | * | 6/2002 | Poll .......................... G02F 1/161 359/275 |
| 2004/0040228 A1 | | 3/2004 | Emde et al. |
| 2004/0095658 A1 | | 5/2004 | Buretea et al. |
| 2005/0181221 A1 | | 8/2005 | Martin et al. |
| 2008/0134596 A1 | | 6/2008 | Brunnhofer et al. |
| 2010/0107526 A1 | | 5/2010 | Brunnhofer et al. |
| 2011/0133940 A1 | | 6/2011 | Margalit |
| 2012/0141699 A1 | * | 6/2012 | Mader ................. E06B 3/66366 52/204.593 |
| 2013/0108815 A1 | | 5/2013 | Trautz et al. |
| 2013/0146141 A1 | | 6/2013 | Pelton et al. |
| 2013/0212957 A1 | | 8/2013 | Cempulik et al. |
| 2014/0130864 A1 | | 5/2014 | Lunt et al. |
| 2014/0311065 A1 | | 10/2014 | Schreiber |
| 2016/0089869 A1 | * | 3/2016 | Parker ..................... B32B 37/08 156/99 |
| 2016/0138326 A1 | * | 5/2016 | Kuster ................ E06B 3/67326 52/204.595 |
| 2017/0152701 A1 | * | 6/2017 | Kuster ................ E06B 3/67339 |
| 2017/0298680 A1 | | 10/2017 | Schreiber et al. |
| 2017/0321472 A1 | * | 11/2017 | Frank .................. E06B 3/66366 |
| 2017/0321473 A1 | * | 11/2017 | Frank .................. E06B 3/66352 |
| 2017/0328119 A1 | * | 11/2017 | Kuster ...................... E06B 3/66 |
| 2018/0038151 A1 | * | 2/2018 | Clarahan .................. E06B 7/02 |
| 2018/0224689 A1 | * | 8/2018 | DeMiglio ......... G02F 1/133305 |
| 2019/0291387 A1 | * | 9/2019 | Neander ................. E06B 3/663 |
| 2019/0383087 A1 | * | 12/2019 | Hermens ............. E06B 3/67326 |
| 2020/0324451 A1 | * | 10/2020 | Kuster ................... B29C 48/12 |
| 2020/0408033 A1 | * | 12/2020 | Haring .................. E06B 3/6612 |
| 2021/0032925 A1 | * | 2/2021 | Neander ............. E06B 3/66366 |
| 2021/0047879 A1 | * | 2/2021 | Neander .................... E06B 9/24 |
| 2021/0079715 A1 | * | 3/2021 | Neander ............. E06B 3/66314 |
| 2021/0079716 A1 | * | 3/2021 | Neander .................... E06B 9/24 |
| 2021/0246714 A1 | * | 8/2021 | Neander ............. E06B 3/66366 |
| 2021/0381303 A1 | * | 12/2021 | Neander ............. E06B 3/66352 |
| 2022/0010609 A1 | * | 1/2022 | Zucker ................ E06B 3/66319 |

FOREIGN PATENT DOCUMENTS

| | | |
|---|---|---|
| DE | 2031576 A1 | 12/1971 |
| DE | 2528570 A1 | 1/1976 |
| DE | 3330305 A1 | 3/1985 |
| DE | 29607069 U1 | 7/1996 |
| DE | 102006010646 A1 | 10/2006 |
| DE | 202007000652 U1 | 10/2007 |
| DE | 202008000678 U1 | 5/2009 |
| DE | 10322561 B4 | 6/2011 |
| DE | 102009057156 A1 | 6/2011 |
| DE | 102010015836 A1 | 10/2011 |
| DE | 202011102438 U1 | 1/2012 |
| DE | 102011087250 A1 | 5/2013 |
| DE | 102013114802 A1 | 6/2015 |
| DE | 102015004913 A1 | 10/2016 |
| EP | 0154428 A2 | 9/1985 |
| EP | 0199233 A1 | 10/1986 |
| EP | 0199233 B1 | 1/1990 |
| EP | 0545022 A1 | 6/1993 |
| EP | 1026790 A1 | 8/2000 |
| EP | 1101955 A1 | 5/2001 |
| EP | 1223188 A1 | 7/2002 |
| EP | 1036813 B1 | 11/2004 |
| EP | 1223188 B1 | 2/2005 |
| EP | 1101955 B1 | 8/2006 |
| EP | 1703063 A1 | 9/2006 |
| EP | 1700348 B1 | 3/2007 |
| EP | 2559838 A2 | 2/2013 |
| EP | 2628884 A2 | 8/2013 |
| EP | 1703063 B1 | 11/2014 |
| EP | 2886778 A1 | 6/2015 |
| EP | 2886778 B1 | 5/2016 |
| EP | 3093423 A1 | 11/2016 |
| EP | 2610425 B1 | 4/2017 |
| GB | 1508778 A | 4/1978 |
| RU | 2293168 C2 | 2/2007 |
| WO | 8802051 A1 | 3/1988 |
| WO | 02052192 A1 | 7/2002 |
| WO | 2005067060 A1 | 7/2005 |
| WO | 2006027146 A1 | 3/2006 |
| WO | 2008022877 A1 | 2/2008 |
| WO | 2009039240 A2 | 3/2009 |
| WO | 2010077409 A2 | 7/2010 |
| WO | 2012055553 A1 | 5/2012 |
| WO | 2012140005 A1 | 10/2012 |
| WO | 2013184831 A2 | 12/2013 |
| WO | 2014004871 A1 | 1/2014 |
| WO | 201504362 A1 | 4/2015 |
| WO | 2016060643 A1 | 4/2016 |
| WO | 2016091646 A1 | 6/2016 |
| WO | 2016116803 A1 | 7/2016 |

OTHER PUBLICATIONS

International Search Report of the International Searching Authority in PCT/EP2018/079585 dated Nov. 30, 2018.
Written Opinion of the International Searching Authority in PCT/EP2018/079585 dated Nov. 30, 2018.

* cited by examiner a)

a1)

a2)

a3)

b)

SPACER FOR PHOTOVOLTAIC APPLICATIONS

CROSS-REFERENCE

This application is the U.S. National Stage of International Application No. PCT/EP2018/079585 filed on Oct. 29, 2018, which claims priority to European patent application no. 17199279.5 filed on Oct. 30, 2017.

TECHNOLOGICAL FIELD

The present invention relates to spacers suitable for photovoltaic applications, in particular a spacer with attached photovoltaic elements, a spacer with electric connections and a spacer suitable for receiving panes, in particular luminescent solar concentrator panes.

BACKGROUND

Insulated glazing is commonly used for windows, doors, and facade elements of buildings. In insulated glazing, usually two or more glazing panes are assembled with one or more spacers to form an insulating glazing unit (IGU) with a hermetically sealed interspace between the glazing panes. In particular, the spacers are usually profiles extending in a longitudinal direction with an essentially constant cross-section along the longitudinal direction, which usually have a kind of chamber for accommodating a desiccant. Such a chamber communicates with the interspace through holes or slits in the spacer wall facing the interspace between the glazing panes or is otherwise open towards the interspace.

The principle of such an IGU and the corresponding spacer is shown in FIGS. 1 to 3 of WO 2006/027146 A1 or WO 2012/055553 A1.

It is known in the art to use IGUs for collecting solar energy as thermal energy or electric energy. An example for collecting solar energy as thermal energy is shown in WO 88/02051 A1. Examples for using solar cells or photovoltaic materials in IGUs are shown in WO 02/052192 A1, WO 2009/039240 A2, WO 2010/077409 A2, EP 0 199 233 A1, DE 296 07 069 U1, DE 33 30 305 A1, DE 10 2006 010 646 A1, DE 20 2008 000 678 U1, DE 20 2011 102 438 U1 and DE 10 2015 004 913 A1 with a photovoltaic element applied as a foil onto a spacer. A window profile with a photovoltaic element is shown in EP 1 703 063 A1.

Luminescent solar concentrators (LSC) are known, for example, from US 2004/0095658 A1, US 2013/0146141 A1, US 2014/0130864 A1, WO 2016/060643 A1 and WO 2016/116803 A1. Such LSCs can be provided with photovoltaic elements along the edges of a corresponding LSC pane. US 2014/0130864 A1 proposes to use LSC panes for integrated solar windows. The use of spacers in insulated glazings with elastic elements for compensating movements or noise or the like are, for example, disclosed in DE-OS 2 031 576, GB 1 508 778 corresponding to DE-OS 25 28 570 and EP 0 545 022 A1. IGUs with more than two panes are disclosed, for example, in EP 1 101 955 A1 (DE 600 29 906 T2) and WO 2016/091646 A1, which also discloses the use of an elastic insert in the middle groove.

The use of some kind of electrical connection or wiring in or at the sealed interspace between glazing panes of IGUs is disclosed, for example, in WO 2014/004871 A1, WO 2013/184831 A2, EP 1 700 348 B1 and DE 103 22 561 B4.

EP 1 026 790 A1 discloses a corner connector with an electric plug for an insulating housing.

US 2005/0181221 A1 discloses an electrically conductive spacer for use in a display screen. EP 2 610 425 B1 discloses a window element with an integrated light source.

DE 20 2007 000 652 U1 discloses a window made from duroplastic material. EP 2 886 778 B1 discloses a corner connector with metallic wires as retaining elements. DE 10 2009 057 156 A1 discloses a triple glazing IGU, in which the middle pane is supported by sealant in a hollow space. EP 2 559 838 A2 discloses an insulating strip for composite profiles for window, door and facade elements, which comprises electrically conductive portions in order to improve the powder coating characteristics. EP 1 223 188 A1 discloses a method for powder coating of plastic profiles using an electrically conductive UV hardening primer. US 2011/0133940 A1 discloses a multi-sheet glazing unit with internal sensor, in which a spacer comprises a groove for receiving an intermediate glazing pane and a sensor is accommodated in a chamber within the spacer. EP 2 628 884 A2 discloses a warm edge curtain kit for IGUs, in which metallic inserts are provided in the outer side walls of the spacer. DE 10 2010 015 836 A1 discloses a spacer for an IGU with a plastic body and a metal mesh embedded in the plastic body and a metal gas barrier foil on the outer side of the plastic body.

SUMMARY

It is an object of the present invention to improve the spacers and IGUs for use with photovoltaic elements.

BRIEF DESCRIPTION OF THE DRAWINGS

Further features and advantages follow from the description of embodiments referring to the drawings. The drawings show.

DETAILED DESCRIPTION

Figure 1:
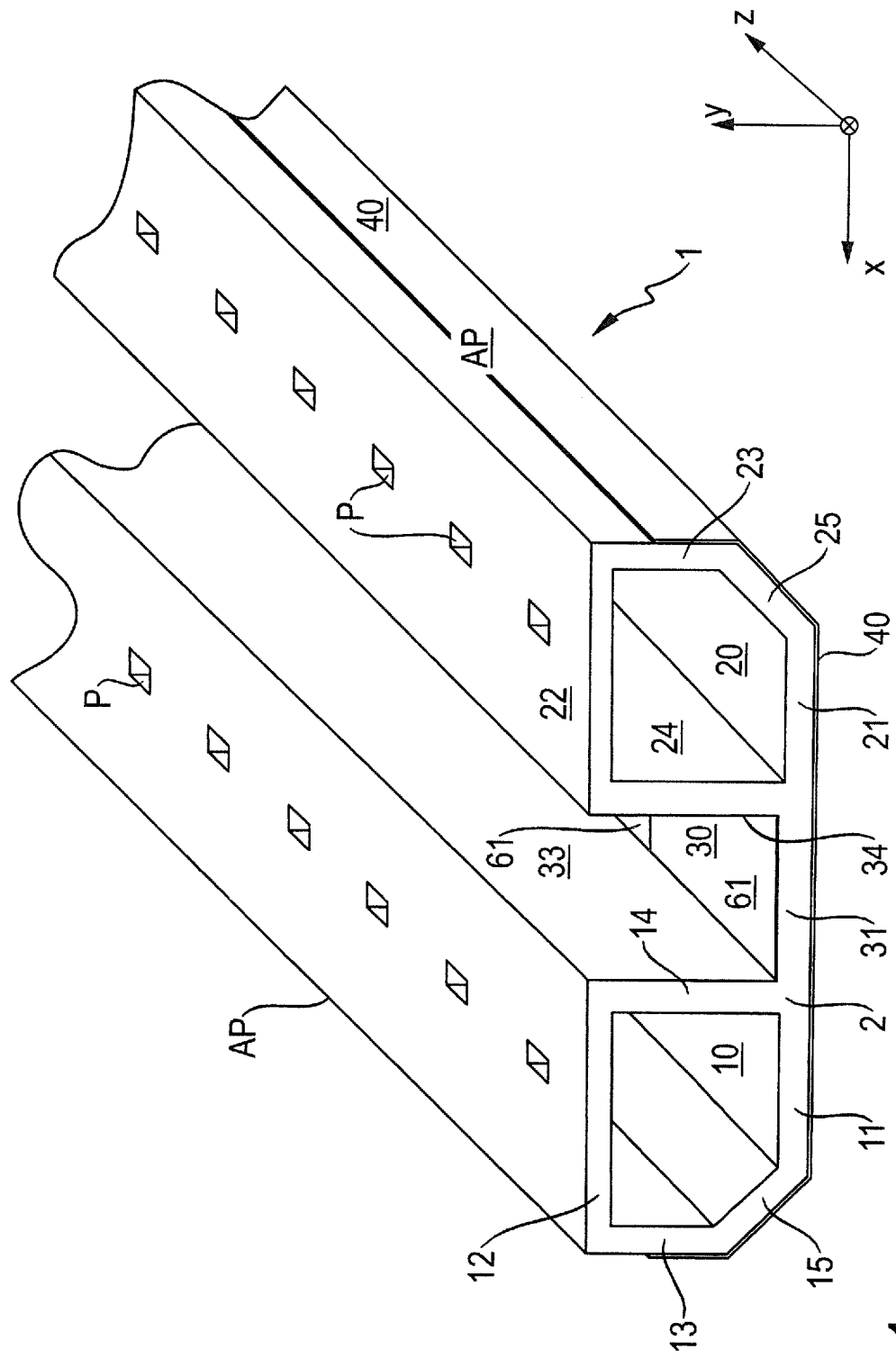
FIG. 1 a first embodiment of a spacer in a perspective view.

FIG. 1 shows a first embodiment of the spacer for use with a triple glazing IGU. The spacer 1 extends in a longitudinal direction z with a cross-section x-y perpendicular to the longitudinal direction z, which is constant along the longitudinal direction z, except for the perforations P.

The spacer comprises a spacer body 2 made of a plastic material. The plastic material may be selected from a group comprising various materials, which can be selected to improve the thermal and mechanical properties of the spacer body 2. The plastic material of the spacer body 2 can be selected from a group comprising polyethylene (PE), polycarbonate (PC), polypropylene (PP), polystyrene, polybutadiene, polynitrile, polyester, polyurethane, polymethylmetacrylate (PMMA), polyacrylate, polyamide, polyethylenterephthalate (PET), polybutylenterephthalate (PBT), acrylonitrile-butadiene-styrene (ABS), acrylic ester-styrene-acrylonitrile (ASA), acrylonitrile-butadiene-styrene-polycarbonate (ABS/PC), styrene-acrylonitrile (SAN), PET/PC, PBT/PC, PMMA, PBT/PET, PP/PE, PVC, PC/ASA, PPE/PPO, and copolymers or mixtures thereof, which can each be formed partially or completely of bio materials formed of renewable resources.

The stiffness of the spacer body 2 can be increased by using, e.g., reinforcing fibers, agents, or other elements. The spacer body 2 can comprise reinforcing fibers such as glass fibers, carbon fibers, aramid fibers, polyethylene fibers, natural fibers, basalt fibers, ceramic fibers, metal fibers, and/or reinforcing agents such as nanoparticles, mineral fillers, sheet silicates and layered silicates, metal powder, talkum and the like. Reinforcing fibers can be selected from different kinds of fibers such as steel fibers, hollow glass fibers, natural fibers, etc. Examples of natural fibers are cotton, jute, hemp, sisal, or regenerated cellulose fibers such as Cordenka or Lenzing. The fibers can be short, long, or endless. Further examples of additives that can be included in the spacer body 2 are montmorillonites, liquid crystal polymers, mica particles, titanium(IV) oxide, wollastonite, hollow or non-hollow spheres of glass, glass particles, hollow or non-hollow ceramic spheres, ceramic particles, and mineral fillers such as kaolin, talc, mica, titanium oxide, calcium carbonate, silicon dioxide and layered silicates, in particular in the form of nanoparticles. These lists of materials are not conclusive.

The spacer body 2 can be made of SAN and comprise glass bubbles corresponding to 10% to 25% of its mass and glass fibers corresponding to 20% to 25% of its mass. The spacer body 2 can be made of SAN and comprise wollastonite corresponding to 35% of its mass or basalt fibers corresponding to 20% to 35% of its mass.

The spacer body 2 can be made of polyamide with glass fibers in the amount of 5% to 50%.

The body comprises two chambers 10, 20, which are separated in a width direction x perpendicular to the longitudinal direction z by a groove 30. The spacer 1 has a first side in a height direction y perpendicular to the longitudinal direction z and to the width direction x, which is designed to face the interspace between the glazing panes of an IGU.

Figure 2:
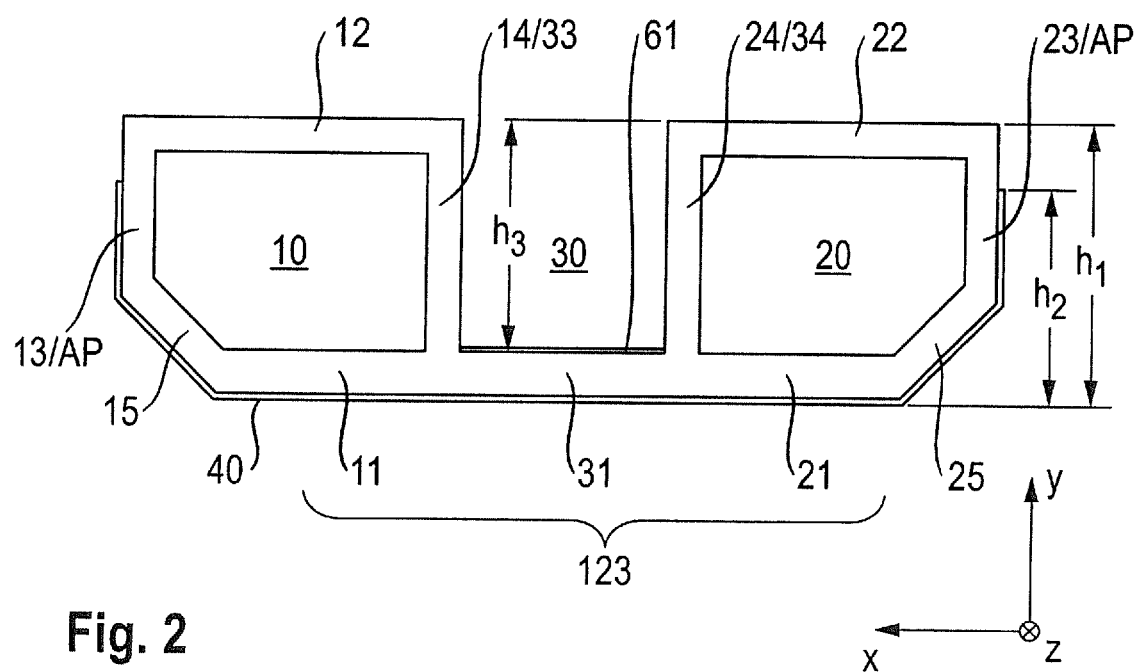
FIG. 2 the spacer of the first embodiment of FIG. 1 in a cross-sectional view.

The spacer has a second side in the height direction y opposite to the first side. At the second side, the spacer comprises a wall 123 (FIG. 2) made of three sections 11, 31, 21 from left to right in FIG. 1, 2. The spacer comprises two outer sides in the width direction x serving as attachment planes AP to the outer panes of the triple glazing IGU. These outer sides/attachment planes are formed by a first outer wall 13 and a second outer wall 23, which extend perpendicular to the bottom wall 123 in the height direction y. The side walls 13, 23 are connected to the bottom wall 123 by connecting portions 15, 25, which extend inclined relative to the height direction y. In the alternative, the side walls 13, 23, can be directly connected to the bottom wall 123 without the intermediate connecting portions 15, 25. The spacer 1 comprises the groove 30 open to the first side, which is limited by a third side wall 14 and a fourth side wall 24, which extend perpendicular from and to the bottom wall 123. The third and fourth side walls 14, 24 are connected to the bottom wall 123 at the transitions between the portions 11, 31 and 31, 21, respectively. The first and third side walls 13, 14 are connected by a first top wall 12 extending parallel to the bottom wall 123 thus forming a chamber 10, which is completely enclosed by the body in the cross-section x-y perpendicular to the longitudinal direction z. The second and the fourth side walls 23, 24 are connected by a second top wall 22 extending in parallel to the bottom wall 123 thus forming a chamber 20 in the same way.

A gas barrier 40 is formed on the outer side towards the second side of the spacer of the bottom wall 123 and continuous thereto on the outer side of the connecting walls 15, 25 and on part of the side walls 13, 23. In the present embodiment, it is made from a thin metal foil, for example steel or stainless steel, vapor-deposited aluminium or sputtered aluminium. The gas barrier can be formed, alternatively, from a diffusion-proof multilayer plastic film having a metallic coating and/or metallic layers. Examples of such multilayer plastic films are known in the art, for example in EP 0 154 428 A2 (Camvac), EP 1 036 813 A1 (Danisco Flexible Schuepbach AG) WO 2013/104507 A1 (Saint Gobain), WO 2016/046081 A1 (Saint Gobain), WO 2015/043626 A1 (Prowerb AG), WO 2012/140005 A1 (Prowerb AG), WO 2008/022877 A1 (Prowerb AG). It is also possible to use multilayer films based on EVOH material, for example the configuration Polyolefins/Tie/EVOH/Tie/Polyolefins as disclosed for example in WO 2012/055553 A1. Other types of gas barrier which can be used are known from DE 198 07 454 A1. Barrier function can be also achieved by treating the base material of the spacer body, for example by fluorination.

It is understood that gas barriers also act as moisture barrier. When the IGU of the present invention is not gas filled, only moisture barrier is necessary.

Photovoltaic elements 61 are formed in the groove 30 on the bottom wall 31. The photovoltaic elements can be formed by printing the photovoltaic material, spray-coating the photovoltaic material (photovoltaic inks), adhering preformed photovoltaic cells, adhering photovoltaic films (either single layer or multilayers), mixing and/or compounding and/or blending the photovoltaic material with the material of the spacer body (or of part of the spacer body) or with specific materials suitable for said methods. Photovoltaic materials are known in the art as for example wafer-based materials (such as single and/or multi crystal-line silicon or GaAs & III-V single junction materials) and thin-film cells currently known as Hydrogenated amorphous silicon (a-Si:H), Cadmium Telluride (CdTe), Copper Indium Gallium diselenide (CIGS), Copper zinc tin sulphide (CZTS), Dye sensitized solar cells (DSSC), Perovskite, Organic PhotoVoltaic materials (OPV), Quantum Dot (QD) PhotoVoltaic.

Figure 6:
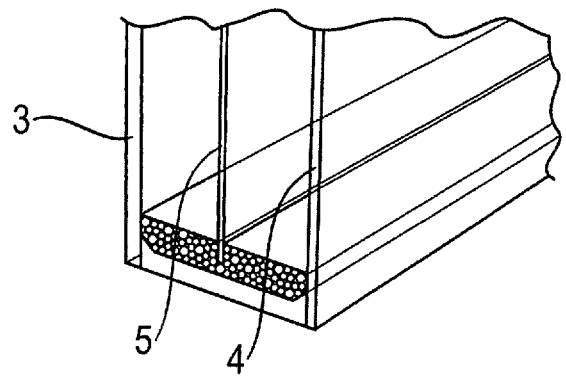
FIG. 6 a perspective view of a triple glazing IGU using the spacer of one of the embodiments.

The spacer 1 has a width in the width direction x adapted to the distance between the two outer glazing panes 3, 4 (see FIG. 6) of the triple glazing IGU. The spacer 1 has a height h1, which is selected appropriately to accommodate sufficient desiccant material in the chambers 10, 20 and to accommodate the intermediate glazing pane 5. The gas barrier 40 extends up to a height h2, which may be significantly lower than the height h1 but high enough to secure a sufficient gas barrier characteristic and/or to secure a reliable connection to the glazing panes as known in the art.

The groove 30 has a height h3 in the height direction y, which is selected to accommodate the intermediate glazing panel as explained below.

The intermediate glazing panel may be of a material having a significantly higher thermal expansion coefficient than the outer glazing panes 3, 4.

Accordingly, the height h3 has to be selected in order to be able to accommodate the significantly larger thermal expansion of the intermediate glazing panel 5. For example, if the intermediate glazing panel is made of PMMA, it has a thermal expansion coefficient of about $8 \times 10^{-5}$ $1/°$ C. which is about 10 times larger than the thermal expansion coefficient of soda lime glass of about $9 \times 10^{-6}$ $1/°$ C. Accordingly, in such a combination, for a pane of 1 m height and for a temperature difference of 100° C., the thermal expansion of such an intermediate glazing pane of PMMA is about 7 mm larger per direction than the one of the outer glazing panes 3, 4 of soda lime glass in case of a temperature change of 100° C. Accordingly, the summed heights h3 of the grooves of the spacers must be at least 8 mm per meter of the dimension of the intermediate glazing pane 5 in the height direction y, to allow a corresponding thermal expansion.

The width of the groove 30 in the width direction x is adapted to accommodate the corresponding intermediate glazing pane.

In the first embodiment, photovoltaic elements 61 are arranged at the bottom of the groove 30.

This allows to insert luminescent solar concentrator (LSC) panes as intermediate glazing panes 5.

The luminescent solar concentrator (LSC) pane 5 is connected to the photovoltaic elements 61 via an appropriate contact allowing the optical transfer from the LSC into the photovoltaic elements. Examples of means to assure bonding with optical transfer are: thin film adhesive means, optical cements, light-curing adhesives, heat curing adhesives, acrylate means, epoxy means, butyl-based means, siloxane means, polyurethane means, paraffins and other waxes, gels.

The photovoltaic elements 61 are electrically connected to the outside of the intermediate space by electrically connecting means, not shown in FIG. 1, too.

Such electrical connections will be further discussed below.

Figure 3:
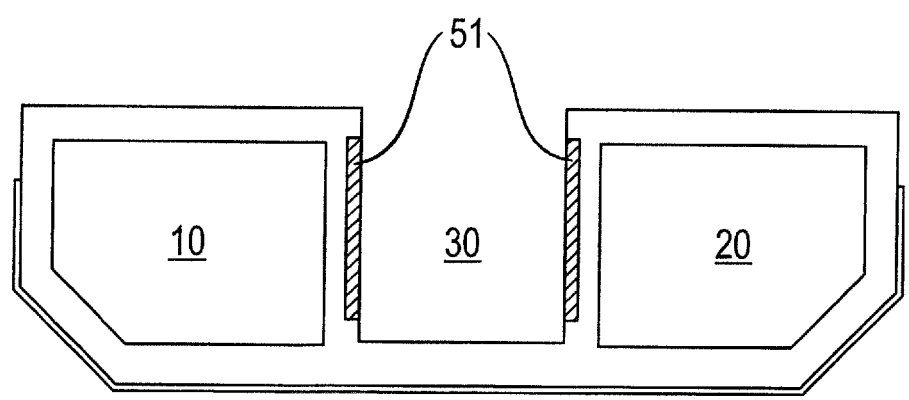
FIG. 3 a cross-sectional view of a second embodiment of the spacer.

FIG. 3 shows a cross-section of a second embodiment of the spacer. All elements of all embodiments correspond to the ones of the first embodiment, except if they are explicitly described differently. Accordingly, not all reference numerals are repeated in all drawings but, of course, the identical or corresponding elements in the different embodiments are the same.

In FIG. 3, the photovoltaic elements 61 are not shown. They could be provided on the bottom wall 31 or not or at another position of the spacer, but the essential difference are the electrically conductive metal sheets 51 provided in the side walls 14, 24 limiting the groove 30 in the height direction y. These metal sheets can be coextruded with the spacer body and potentially the gas barrier at the time of manufacturing, for example. If photovoltaic elements are provided at the bottom of the groove 30 or at another position of the spacer, they can be connected with the electrically conductive metal sheets 51.

The electrically conductive metal sheets 51 are electrically isolated from each other through the plastic material of the body 2.

Figure 10:
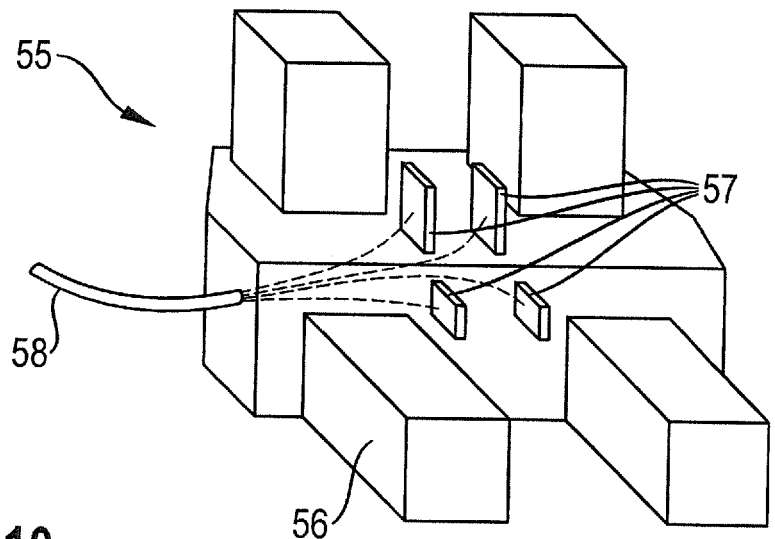
FIG. 10 a perspective view of an embodiment of a corner connector for connecting with the embodiments of the spacers.

The electrically conductive metal sheets allow to use connectors, linear connectors or corner connectors, which have conductive portions coming into contact with the electrically conductive metal sheets 51 and allowing a sealed electrical connection to the outside of the hermetically sealed interspace, without breaking the seal. One possible example of such a connector is shown as a corner connector 55 in FIG. 10. The corner connector comprises protrusions 56 to be inserted into hollow spaces here represented by the chambers 10, 20, respectively, of the spacer 1. The corner connector comprises four electrically connecting portions 57 (e.g. metal sheets), two per spacer section to be connected by the corner connector 55, which are adapted to contact the electrically conductive metal sheets 51 provided in the side walls 14, 24 of the second embodiment in FIG. 3 or with the other electrically conductive portions of embodiments described further below, in the state when the protrusions are inserted into hollow spaces here represented by the chambers 10, 20, respectively, of the spacer 1. The electrically connecting portions 57 are connected to wires 58 which are provided in a gas tight manner from the four electrically connecting portions 57 to the outside of the connector which will be positioned outside the hermetically sealed interspace of the IGU in the assembled state of the spacer and connector in a corresponding IGU.

Figure 4:
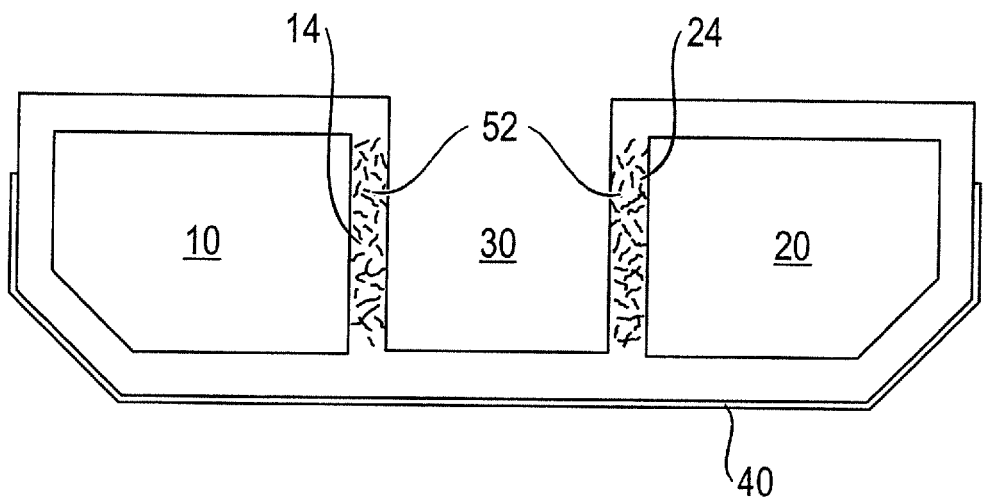
FIG. 4 a cross-sectional view of a third embodiment of the spacer.

FIG. 4 is a cross-section of a third embodiment. In the third embodiment, the side walls 14, 24 limiting the groove 30 are provided with electrically conductive portions, which are manufactured by coextruding electrically conductive fillers such as metal fibres. The electrically conductive portions 52 allow, in the same way as the metal sheets 51 in the second embodiment, an electrical connection of the photovoltaic elements provided in the groove 30.

Figure 5:
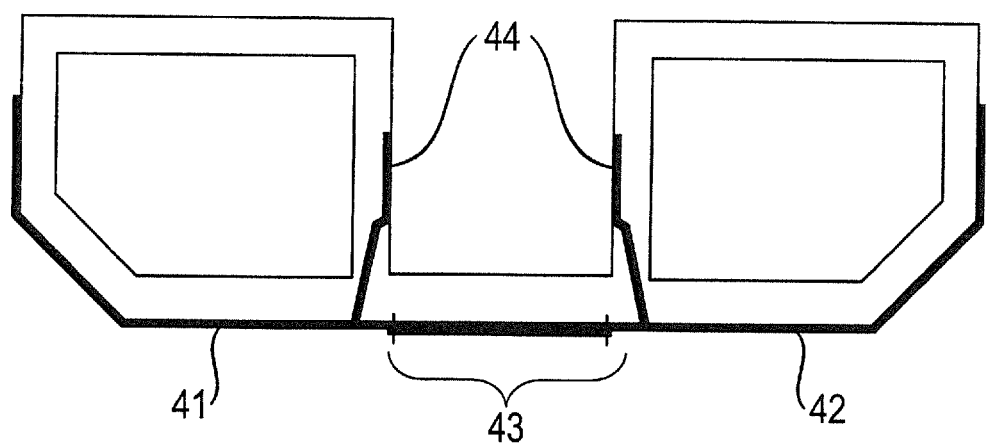
FIG. 5 a cross-sectional view of a fourth embodiment of the spacer.

FIG. 5 shows a fourth embodiment. In the fourth embodiment, a gas barrier has three portions 41, 42, 43. The portions located on the left and right side in the width direction are electrically conductive, while the portion separating the outer portions 41, 42 is electrically non-conductive. The non-conductive portion 43 could be made, for example, of any suitable diffusion proof resin like for example EVOH material as described above concerning the gas barrier, butyl material (example polyisobutylene) and glass-based barriers. Barrier function can be also achieved by treating the base material of the spacer body, for example by fluorination.

The outer electrically conductive portions 41, 42 of the gas barrier are connected to electrically conductive contact portions 44, which are, again, open to the groove 30 in the same way as the metal sheets 51 of the second embodiment. The electrically conductive contact portions 44 could be coextruded metal sheets or could be conductive portions provided by coextruding conductive fillers and the like.

In the first to fourth embodiments, whether photovoltaic elements 61 are provided at the bottom of the groove 30 or not, it is enabled to transmit electric current to the outside of the hermetically sealed interspace between the window panes without breaking the seals by using corresponding electrically conductive portions 51, 52, 44, 41, 42 and corresponding connectors 55. In the same way, an LSC pane 5 could be inserted into the groove, which is already provided with photovoltaic elements to collect the concentrated light and converted into electric power. Also in these cases, the electrical connections can be used to connect the LSC with the photovoltaic elements (photovoltaic device) to the outside of the hermetically sealed interspace. In an alternative, the electric power could be transmitted to the outside of the hermetically sealed interspace in a wireless manner. This can be achieved by using one or more coils (transmitting side) provided at the spacer in the hermetically sealed interspace, which are connected to the electrically connecting portions. Outside the hermetically sealed interspace, corresponding coils (receiving side) are provided.

LSC panes 5 may be in the form of a body made of glass or plastic material in which nano-crystal are homogeneously dispersed or may be in the form of a thin film composite consisting of a layer of heavily doped material, such as a polymer, on top of a transparent substrate, such as glass.

Depending on the base material, LSC panes 5 will usually have a significantly higher thermal expansion coefficient than the outer glazing panes, which are usually made of glass made out of soda-calcium silicates, borosilicate glass, ceramic glass, alkaline glass, Pb glass, crystal, ETFE, whilst typical materials for LSC are polyacrylates and polymethylmethacrilates, poly-carbonates, and other materials as known for example from WO 2016/116803 A1. Same materials can be used for outer panes too.

Accordingly, the LSC will significantly move within the groove 30 during the normal use when the sunlight heats the corresponding IGU or the corresponding IGU is cooled due to lack of sunlight or at night or in winter.

Figure 9:
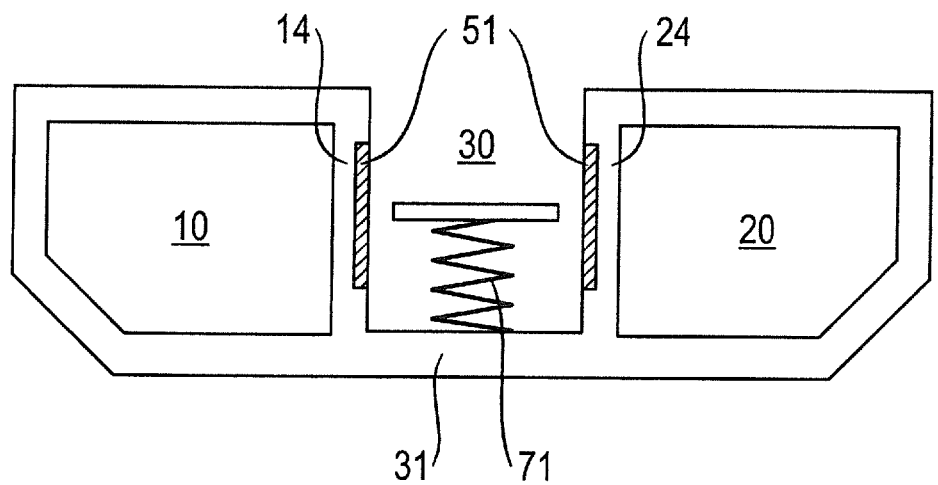
FIG. 9 a cross-sectional view of a fifth embodiment of a spacer.
Figure 11:
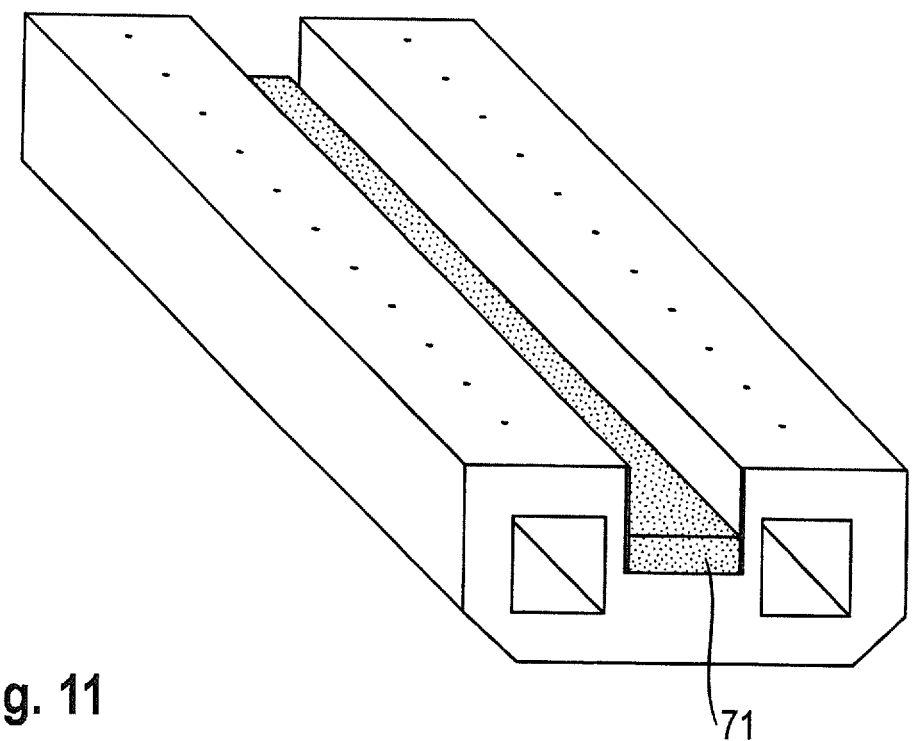
FIG. 11 a perspective view of a modification of the fifth embodiment of the spacer; a FIG. 12 a perspective view of a LSC pane for use with the embodiments of the spacers in IGUs, FIG. 13 a perspective and cross-sectional view of a seventh embodiment of a spacer.

A fifth embodiment of the spacer is shown in FIG. 9, which comprises an elastic device for compensating such movements. Suitable means to compensate the movements are spring means which could be made of metal or suitable plastic materials. The embodiment shown in FIG. 9 is a modification of the second embodiment shown in FIG. 3 with the electrically conductive metal sheets 51 in the surfaces of the side walls 14, 24. It goes without saying that an LSC having attached photovoltaic elements moving within the groove 30 should stay in contact with the conductive metal sheets 51 in order to secure the function. This can be achieved by the compensating means. FIG. 11 shows a modification of the fifth embodiment in which the suitable means to compensate the movements is/are one or plural foam elements.

It is also possible to provide the photovoltaic elements 61 on the elastic means 71 and to secure the electrical connection in the following way.

Figure 12:
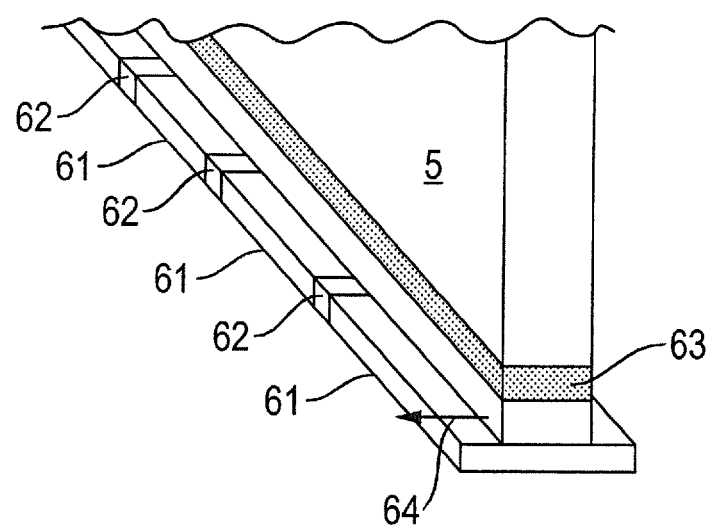

FIG. 12 shows an embodiment of a LSC with photovoltaic elements 64 attached to a support plate 61 made of, for example, plastic material and to the LSC pane 5 by means of a transmitting glue 63. The support plate 61 is provided with regularly arranged, longitudinally spaced electrically conducting output portions (junctions) 62 that contact the electrically conductive portions of the spacer, e.g. the electrically conductive metal sheets 51 in the groove 30 of FIG. 3.

Figure 13:
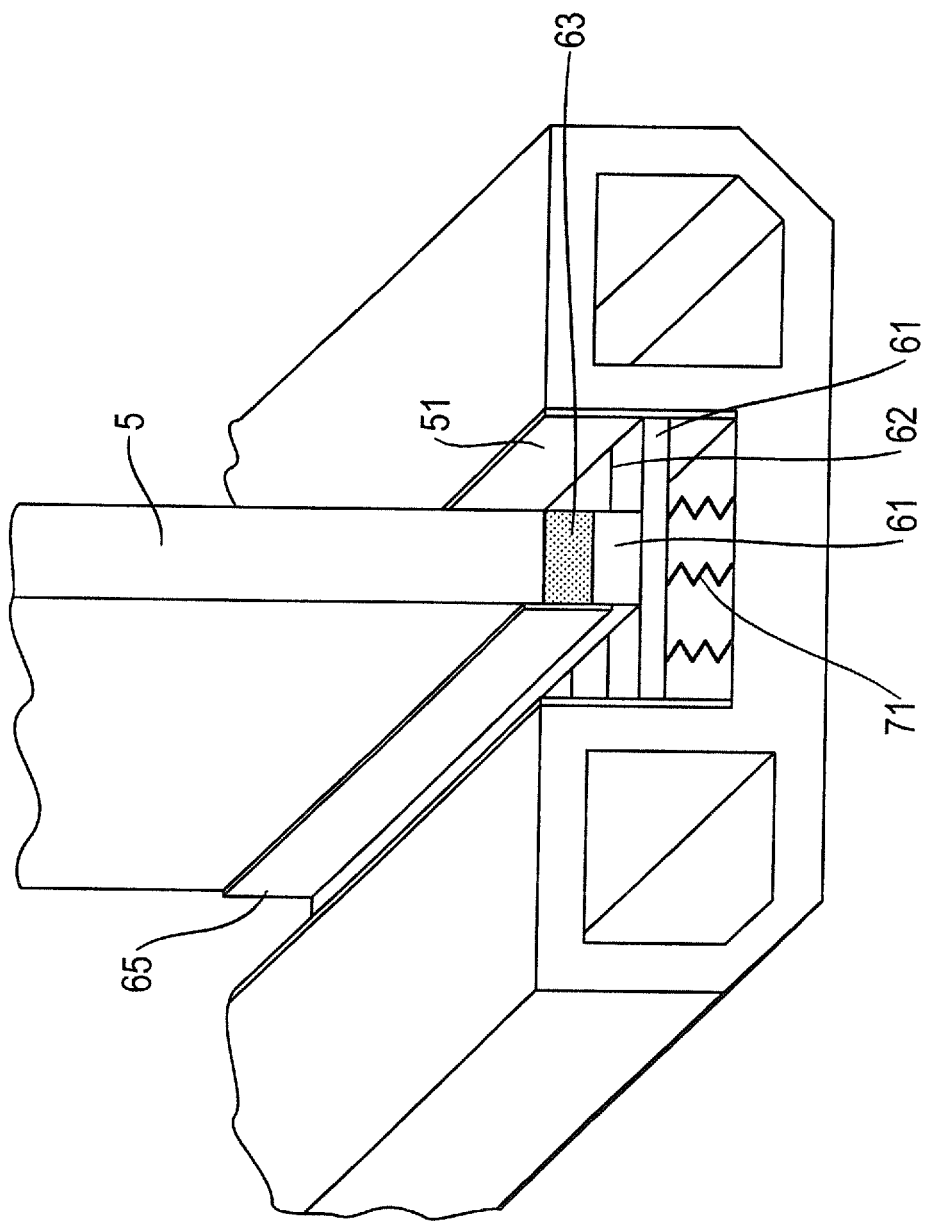

Reflective elements in form of e.g. foils or tapes 65 made of e.g. reflective material (mirror) can be applied at the edge region of the main surface of the intermediate pane (LSC) to assure that the light is directed to the edge of the intermediate pane and then transmitted to photovoltaic elements. FIG. 13 shows the application of both the support plate 61 described above and the reflective foil 65 described here.

Figure 14:
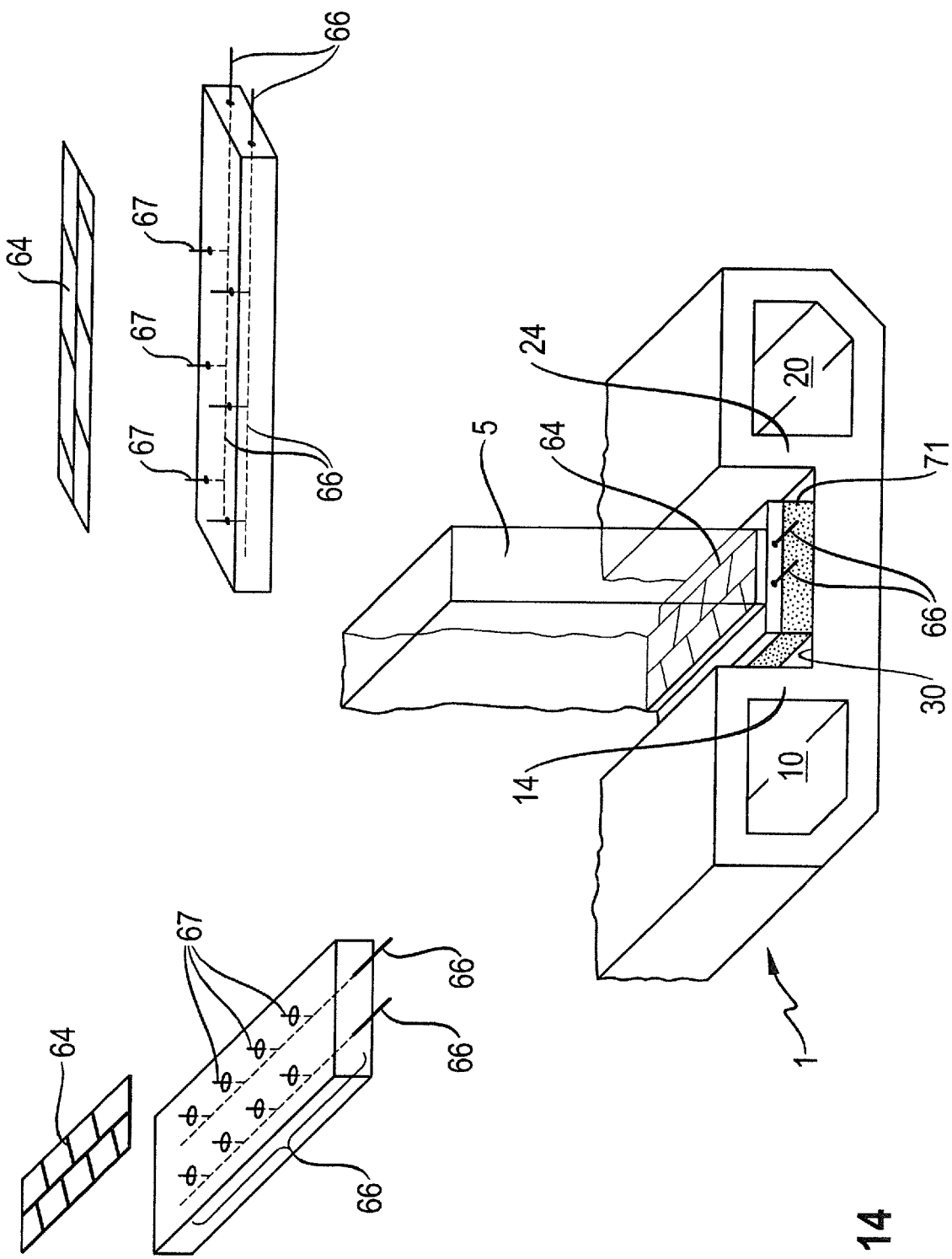
FIG. 14 a perspective and cross-sectional view of an eighth embodiment of a spacer with the assembled intermediate pane shown in the bottom and exploded views in the top part of the figure.

A variation of the support plate design described above is shown in FIG. 14. Here, longitudinal conductive elements in form of wires 66 are embedded in the support plate 61 and connected to photovoltaic elements 64 (attached to the main surface of support plate 61) via pins 67 branched off at regular intervals from the wires 66. The longitudinal wires 66 protrude from the end surface of the support plate 61 forming plugs 68 (or sockets) which can be engaged by a connector suitably designed with corresponding receiving sockets (or plugs). In this case, the spacer profile does not need electrically conductive portions.

Figure 15:
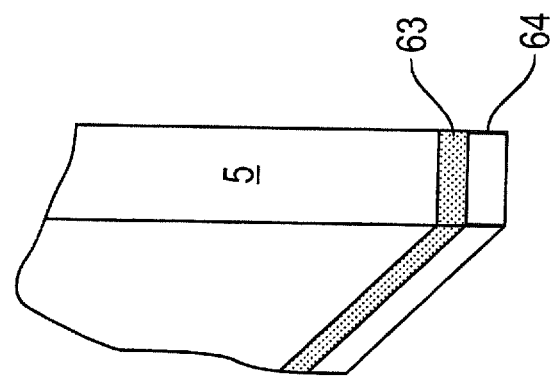
FIG. 15 a perspective and cross-sectional view of a ninth embodiment of the spacer.
Figure 15:
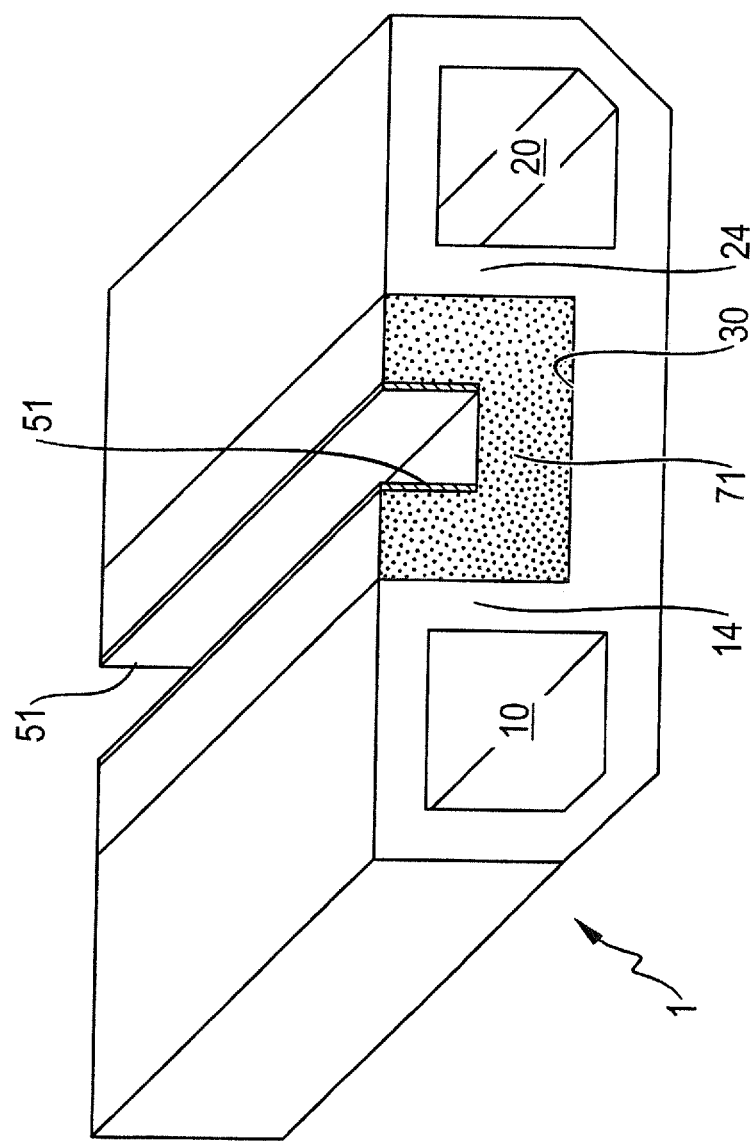

It is also possible to provide the electrically conductive portions on the elastic means 71 as shown in FIG. 15. Here, the elastic means (e.g. foam) 71 arranged in the groove 30 is U-shaped with the internal surfaces of the two legs of the U covered by electrically conducting strips 51 which may also have reflective function of reflective foils 65 as explained above. In this embodiment, the U-shaped elastic means is designed to provide some interference in the width direction with the intermediate pane (LSC) such as a smaller distance of the conductive surfaces in the width direction than the width of the inserted pane such that stable electrical connection between the photovoltaic elements (attached to intermediate pane) and the electrically conducting strips is assured.

Figure 7:
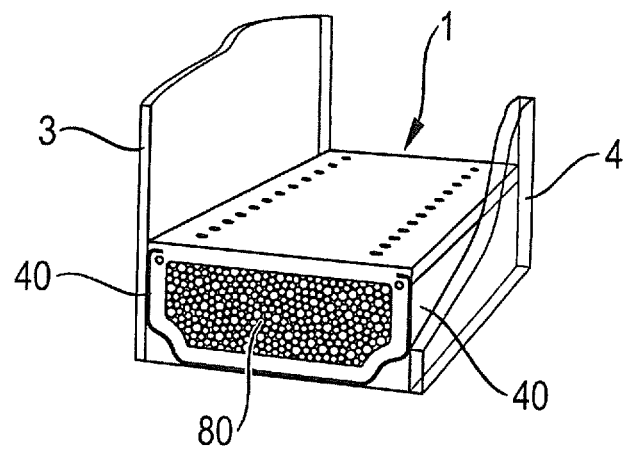
FIG. 7 a perspective view of a double glazing IGU.

FIG. 7 shows a double glazing IGU with a conventional spacer.

Figure 8:
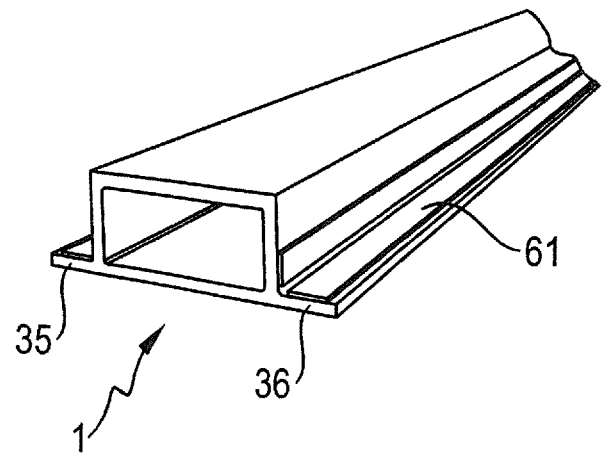
FIG. 8 a perspective view of a sixth embodiment of the spacer for use in a double glazing IGU.

If the outer panes 3, 4 of the IGU are replaced by LSC panes 3, 4, the spacer can be modified as shown in FIG. 8. The sixth embodiment shown in FIG. 8 shows a conventional box design of a spacer with protruding flat portions 35, 36 at the bottom side. The protruding flat portions carry photovoltaic elements 61. Therefore, the LSCs can be put on the flat portions 35, 36 extending in the width direction allowing to collect and to convert the light collected by the LSCs into electric energy.

The spacers may be designed with more than one groove such that more than one intermediate panel can be accommodated within the IGU, thus allowing to get more electrical energy per square meter of window.

Figure 16:
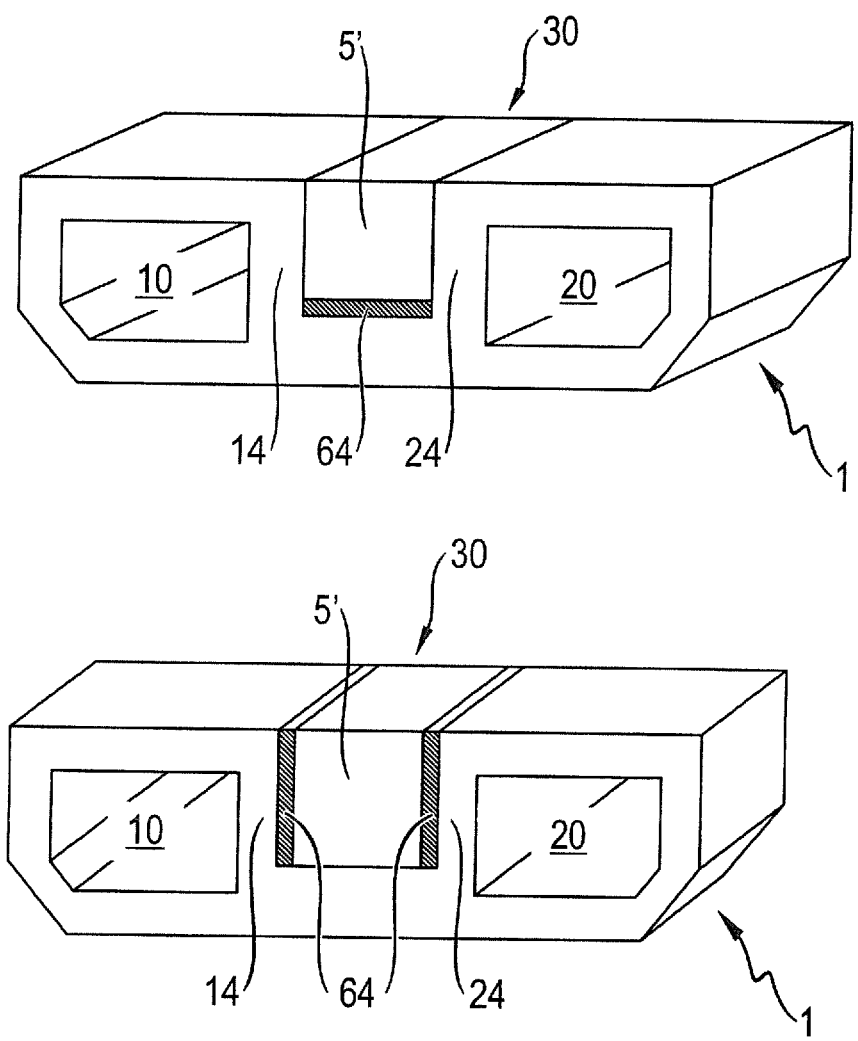
FIG. 16 a perspective and cross-sectional view of embodiments of spacers for use with LSC bars, and FIGS. 17a1)-a3) perspective and cross-sectional views of three embodiments of single cavity spacers with grooves on the top side facing the interspace of the IGUs, and FIG. 17b) an embodiment of a spacer with a recess at one lateral side.

It is also possible to use LSC elements in form of bars 5', instead of panes 5, accommodated in the groove 30. FIG. 16 shows two possibilities how to arrange photovoltaic elements 64 in this case.

Figure 17:
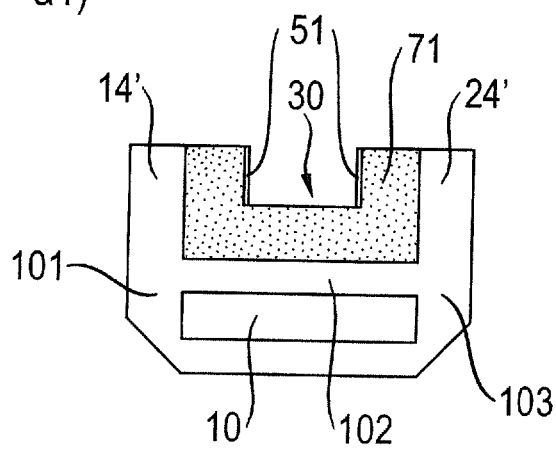
Figure 17:
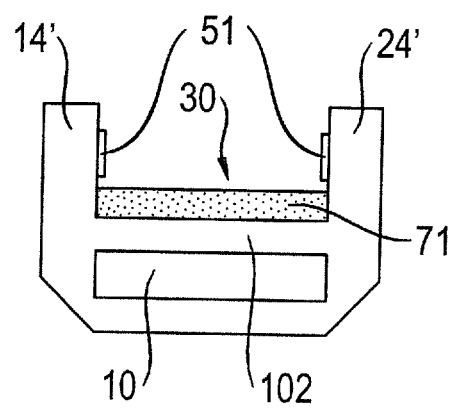
Figure 17:
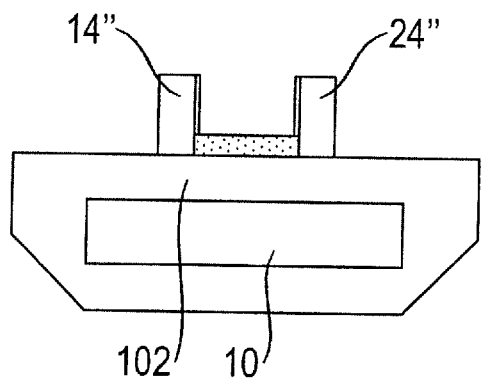
Figure 17:
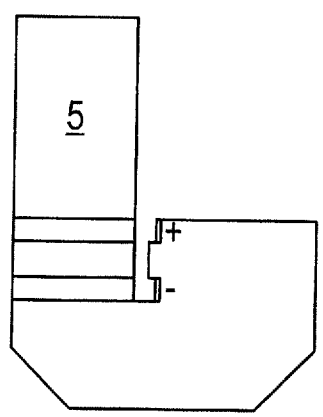

The spacer does not necessarily have to have two hollow chambers but the intermediate pane 5 can be supported by the top wall of a single cavity spacer profile. In this case, the spacer should be designed such that the intermediate pane 5 is conveniently accommodated. FIG. 17 *a*) shows three embodiments in a1), a2) and a3) where the groove 30 is formed on the top wall 102 of the spacer 1 and limited in the width direction x by two side walls 14', 24', which are the prolongations 14', 24' of the two outer side walls 101, 103 in height direction y towards the interspace of the IGU (FIG. 17 *a*), a1) or a2)), or [by two vertical walls 14", 24" extending in the height direction y in the central section of the top wall 102. In both cases, arrangement of electrically conducting portions 51 and elastic means 71 can be done as described above.

The intermediate pane 5 is not necessarily accommodated in the middle of the spacer but can be asymmetrically placed. FIG. 17 *b*) shows an embodiment where the intermediate pane 5 is positioned on the left side of the spacer. In this case, there is no groove in U-shape but a lateral recess or step 31. The two electrically conducting portions are both located on the vertical wall of the recess 31 and are separated by the plastic material of the body of the spacer itself.

The single cavity spacer with groove 30 or recess 31 can be claimed as a spacer for insulating glazing units with at least three glazing panes enclosing at least one hermetically sealed interspace between at least two glazing panes, comprising a spacer body (2) made from a first material and extending in a longitudinal direction (z) having two outer surfaces (AP) in a width direction (x) perpendicular to the longitudinal direction (z) for attachment to outer glazing panes (3, 4) of an insulating glazing unit, and a gas barrier (40) made from a second material, the spacer body having a cross-section (x-y) perpendicular to the longitudinal direction (z) with a first chamber (10) for accommodating desiccant material (80) and a groove (30) arranged on a top wall (102) of the spacer and open to a first side of the spacer in a height direction (y) perpendicular to the longitudinal and the width directions (z,x), the gas barrier (40) being arranged on and/or in the spacer body on/at a second side of the spacer in a height direction (y), which second side is on the opposite side of the spacer with respect to the first side, and the groove (30) being limited in the width direction by two side walls (14', 24; 14", 24") and in the height direction on the second side by the top wall (102) and the groove (30) being adapted to receive an intermediate glazing pane (5), wherein the spacer comprises at least two electrically conducting portions (51) which are electrically isolated from each other and are positioned in one or both of the side walls (14, 24) and/or the bottom wall (102) of the groove (30), or wherein the spacer comprises a lateral recess (31) instead of the groove (30), the lateral recess being formed as a stepped portion in one of the outer surfaces (AP) and having a width in the width direction slightly larger than the width of an intermediate glazing pane (5) to be received in the recess, and wherein the spacer comprises at least two electrically conducting portions (51) which are electrically isolated from each other and are positioned in the wall limiting the recess in the width direction (x) and/or the bottom wall of the groove (31).

The spacers have especially in common a groove adapted to accommodate an intermediate element like a pane or a bar, especially a LSC pane or bar, and/or electrically conductive elements for allowing to conduct electric power out of the hermetically sealed interspace of IGUs, and/or photovoltaic elements and/or elastic elements, or a corresponding recess.

A synergetic effect with the electrically conductive elements is achieved using connectors adapted to conduct the electric power through the seal.

The following aspects represent potential claims and could be subject of amendments or additional applications such as divisional applications:

1. Spacer for insulating glazing units with three or more glazing panes enclosing at least one hermetically sealed interspace between at least two glazing panes, comprising a spacer body (2) made from a first material and extending in a longitudinal direction (z) having two outer surfaces (AP) in a width direction (x) perpendicular to the longitudinal direction (z) for attachment to outer glazing panes (3, 4) of an insulating glazing unit, and a gas barrier (40) made from a second material, the spacer body having a cross-section (x-y) perpendicular to the longitudinal direction (z) with a first chamber (10) for accommodating desiccant material arranged adjacent to a first one (AP, 13) of the two outer surfaces and a second chamber (10) for accommodating desiccant material arranged adjacent to a second one (AP, 23) of the two outer surfaces and a groove (30) arranged between the first and second chambers (10, 20) in the width direction (x) and open to a first side of the spacer in a height direction (y) perpendicular to the longitudinal and the width directions (z,x), the gas barrier (40) being arranged on and/or in the spacer body on/at a second side of the spacer in a height direction (y), which second side is on the opposite side of the spacer with respect to the first side, and the groove (30) being limited in the width direction by two side walls (14, 24) and in the height direction on the second side by a bottom wall (31) and the groove (30) being adapted to receive an intermediate glazing pane (5), wherein the spacer comprises at least two electrically conducting portions (51, 52, 44, 53, 54) which are electrically isolated from each other and are positioned in one or both of the side walls (14, 24) and/or the bottom wall (31) of the groove (30).

2. Spacer according to aspect 1, further comprising one or plural photovoltaic elements (61) arranged in the groove (30).

3. Spacer according to aspect 1 or 2, further comprising at least one elastic body (71) arranged in the groove (30), which is adapted to compensate movements of an intermediate glazing pane (5).

4. Spacer for insulating glazing units with three or more glazing panes enclosing at least one hermetically sealed interspace between at least two glazing panes, comprising a spacer body (2) made from a first material and extending in a longitudinal direction (z) having two outer surfaces (AP) in a width direction (x) perpendicular to the longitudinal direction (z) for attachment to outer glazing panes (3, 4) of an insulating glazing unit, and a gas barrier (40) made from a second material, the spacer body having a cross-section (x-y) perpendicular to the longitudinal direction (z) with a first chamber (10) for accommodating desiccant material arranged adjacent to a first one (AP, 13) of the two outer surfaces and a second chamber (10) for accommodating desiccant material arranged adjacent to a second one (AP, 23) of the two outer surfaces and a groove (30) arranged between the first and second chambers (10, 20) in the width direction (x) and open to a first side of the spacer in a height direction (y) perpendicular to the longitudinal and the width directions (z,x), the gas barrier (40) being arranged on and/or in the spacer body on/at a second side of the spacer in a height direction (y), which second side is on the opposite side of the spacer with respect to the first side, and the groove (30) being limited in the width direction by two side walls (14, 24) and in the height direction on the second side by a bottom wall (31) and the groove (30) being adapted to receive an intermediate glazing pane (5), wherein the spacer comprises one or plural photovoltaic elements (61) arranged in the groove (30).

5. Spacer according to aspect 4, further comprising
at least one elastic body (71) arranged in the groove (30), which is adapted to compensate movements of an intermediate glazing pane (5).

6. Spacer for insulating glazing units with three or more glazing panes enclosing at least one hermetically sealed interspace between at least two glazing panes, comprising
a spacer body (2) made from a first material and extending in a longitudinal direction (z) having two outer surfaces (AP) in a width direction (x) perpendicular to the longitudinal direction (z) for attachment to outer glazing panes (3, 4) of an insulating glazing unit, and a gas barrier (40) made from a second material, the spacer body having a cross-section (x-y) perpendicular to the longitudinal direction (z) with a first chamber (10) for accommodating desiccant material arranged adjacent to a first one (AP, 13) of the two outer surfaces and a second chamber (10) for accommodating desiccant material arranged adjacent to a second one (AP, 23) of the two outer surfaces and a groove (30) arranged between the first and second chambers (10, 20) in the width direction (x) and open to a first side of the spacer in a height direction (y) perpendicular to the longitudinal and the width directions (z,x), the gas barrier (40) being arranged on and/or in the spacer body on/at a second side of the spacer in a height direction (y), which second side is on the opposite side of the spacer with respect to the first side, and the groove (30) being limited in the width direction by two side walls (14, 24) and in the height direction on the second side by a bottom wall (31) and the groove (30) being adapted to receive an intermediate glazing pane (5), wherein the spacer comprises at least one elastic body (71) arranged in the groove (30), which is adapted to compensate movements of an intermediate glazing pane (5).

7. Spacer according to one of aspects 1 to 6, wherein
the first material is a plastic material and
the second material is metal or another gas diffusion tight material.

8. Spacer according to one of aspects 1 to 7, wherein
the groove (30) is adapted to receive an intermediate glazing pane (5), which is a luminescent solar concentrator pane and/or which is provided with a photovoltaic device.

9. Spacer according to one of aspects 3, 5, 6 or according to claim 7 or 8, when dependent on one of aspects 3, 5, 6, wherein
at least one elastic body (71) is a spring element arranged in the groove (30).

10. Spacer according to one of aspects 1 to 9, wherein the gas barrier (40) comprises two electrically conductive sections (41, 42) which are electrically isolated by an electrically non-conductive section (43) of the gas barrier arranged between the electrically conductive sections (41, 42) in the width direction.

11. Insulating glazing unit, comprising
three or more glazing panes (3, 4, 5) enclosing at least one hermetically sealed interspace between at least two glazing panes (3, 4), and
a spacer according to one of aspects 1 to 10,
wherein one of the three or more glazing panes (3, 4, 5) is an intermediate glazing pane (5) formed as a luminescent solar concentrator pane provided with a photovoltaic device and received in the groove (30) of the spacer (2) and the photovoltaic device is electrically connected to the at least two electrically conducting portions (51, 52, 44, 53, 54).

12. Insulating glazing unit, comprising
three or more glazing panes (3, 4, 5) enclosing at least one hermetically sealed interspace between at least two glazing panes (3, 4), and
a spacer according to one of aspects 1 to 10,
wherein one of the three or more glazing panes (3, 4, 5) is an intermediate glazing pane (5) provided with a photovoltaic device and received in the groove (30) of the spacer (2) and the photovoltaic device is electrically connected to the at least two electrically conducting portions (51, 52, 44, 53, 54).

13. Insulating glazing unit, comprising
three or more glazing panes (3, 4, 5) enclosing at least one hermetically sealed interspace between at least two glazing panes (3, 4), and
a spacer according to one of aspects 1 to 10,
wherein one of the three or more glazing panes (3, 4, 5) is an intermediate glazing pane (5) formed as a luminescent solar concentrator pane and received the groove (30) of the spacer (2),
wherein the spacer comprises one or plural photovoltaic elements (61) arranged in the groove (30) and optically connected to the luminescent solar concentrator pane received in the groove (30), and
the one or plural photovoltaic elements (61) is/are electrically connected to the at least two electrically conducting portions (51, 52, 44, 53, 54).

14. Insulating glazing unit according to one of aspects 11 to 13, wherein
the spacer comprises at least one elastic body (71) arranged in the groove (30), which is adapted to compensate the movements of the intermediate glazing pane (5) such that the electrical connection of the photovoltaic device and the one or plural photovoltaic elements (61), respectively, to the at least two electrically conducting portions (51, 52, 44, 53, 54) is maintained during such movements.

15. An insulating glazing unit comprising
three or more glazing panes (3, 4, 5) enclosing at least one hermetically sealed interspace between at least two glazing panes (3, 4), and
a spacer according to one of aspects 1 to 10,
wherein one of the three or more glazing panes (3, 4, 5) is an intermediate glazing pane (5) formed as a luminescent solar concentrator pane and received in the groove (30) of the spacer (2),
wherein the spacer comprises one or plural photovoltaic elements (61) arranged in the groove (30) and optically connected to the luminescent solar concentrator pane received in the groove (30), and
the spacer comprises at least one elastic body (71) arranged in the groove (30), which is adapted to compensate movements of the intermediate glazing pane (5).

It is explicitly stated that all features disclosed in the description and/or the claims are intended to be disclosed separately and independently from each other for the purpose of original disclosure as well as for the purpose of restricting the claimed invention independent of the composition of the features in the embodiments and/or the claims. It is explicitly stated that all value ranges or indications of groups of entities disclose every possible intermediate value or intermediate entity for the purpose of original disclosure as well as for the purpose of restricting the claimed invention, in particular as limits of value ranges.

The invention claimed is:

1. A spacer for an insulating glazing unit having a first outer glazing pane, a second outer glazing pane and an intermediate glazing pane, the first outer glazing pane and the second outer glazing pane enclosing a hermetically sealed interspace, the spacer comprising:
a spacer body comprising a first material and extending in a longitudinal direction (z) having a first outer surface and a second outer surface in a width direction (x) perpendicular to the longitudinal direction (z) for attachment to the first outer glazing pane and the second outer glazing pane, respectively, and a gas barrier comprising a second material,
the spacer body having a cross-section (x-y) perpendicular to the longitudinal direction (z) with a first hollow chamber for accommodating a desiccant material, the first hollow chamber being completely enclosed by the spacer body in the cross-section perpendicular to the longitudinal direction (z) and arranged adjacent to the first outer surface and a second hollow chamber for accommodating the desiccant material, the second hollow chamber being completely enclosed by the spacer body in the cross-section perpendicular to the longitudinal direction (z) and arranged adjacent to the second outer surface and a groove between the first and second hollow chambers in the width direction (x) and open to a first side of the spacer in a height direction (y) perpendicular to the longitudinal direction (z) and the width direction (x), the gas barrier being arranged on and/or in the spacer body at a second side of the spacer in the height direction (y), the second side being opposite the first side of the spacer in the height direction (y), and the groove being delimited in the width direction by a first side wall and a second side wall and on the second side by a bottom wall, the groove being configured to receive the intermediate glazing pane, wherein the spacer comprises at least two electrically conductive portions electrically isolated from each other and positioned on or in the first side wall and/or on or in the second side wall and/or on or in the bottom wall of the groove, and at least a portion of each of the at least two electrically conductive portions is exposed at a surface of the groove.

2. The spacer according to claim 1, further comprising at least one photovoltaic element in the groove.

3. The spacer according to claim 1, further comprising at least one elastic body in the groove and configured to compensate movements of the intermediate glazing pane.

4. The spacer according to claim 1, wherein
the first material is a plastic material and
the second material is a gas impermeable material.

5. The spacer according to claim 1, including the intermediate glazing pane, wherein the intermediate glazing pane comprises a luminescent solar concentrator pane and/or the intermediate glazing pane includes a photovoltaic device.

6. The spacer according to claim 3, wherein the at least one elastic body is a spring element.

7. The spacer according to claim 1, wherein the gas barrier comprises two electrically conductive sections electrically isolated by an electrically non-conductive section between the two electrically conductive sections in the width direction.

8. An insulating glazing unit, comprising
the spacer according to claim 1;
the first outer glazing pane mounted onto the first outer surface of the spacer body,
the second outer glazing pane mounted onto the second outer surface of the spacer body, and the intermediate glazing pane mounted in the groove,
wherein the intermediate glazing pane includes a luminescent solar concentrator pane having a photovoltaic device electrically connected to the at least two electrically conductive portions.

9. An insulating glazing unit, comprising:
the spacer according to claim 1,
the first outer glazing pane mounted onto the first outer surface of the spacer body,
the second outer glazing pane mounted onto the second outer surface of the spacer body, and the intermediate glazing pane mounted in the groove,
wherein the intermediate glazing pane includes a photovoltaic device electrically connected to the at least two electrically conductive portions.

10. An insulating glazing unit, comprising:
the spacer according to claim 1,
the first outer glazing pane mounted onto the first outer surface of the spacer body,
the second outer glazing pane mounted onto the second outer surface of the spacer body, and the intermediate glazing pane mounted in the groove,
wherein:
the intermediate glazing pane is formed as a luminescent solar concentrator pane,
the spacer comprises one or plural photovoltaic elements arranged in the groove and optically connected to the luminescent solar concentrator pane, and
the one or plural photovoltaic element is/are electrically connected to the at least two electrically conductive portions.

11. An insulating glazing unit according to claim 9, wherein the spacer comprises at least one elastic body in the groove configured to maintain the electrical connection between the photovoltaic device and the at least two electrically conductive portions during movements of the intermediate glazing pane.

12. An insulating glazing unit comprising:
the spacer according to claim 1,
the first outer glazing pane mounted onto the first outer surface of the spacer body,
the second outer glazing pane mounted onto the second outer surface of the spacer body, and the intermediate glazing pane mounted in the groove,
wherein:
the intermediate glazing pane is formed as a luminescent solar concentrator pane,
the spacer comprises one or plural photovoltaic elements in the groove and optically connected to the luminescent solar concentrator pane, and
the spacer comprises at least one elastic body in the groove configured to compensate movements of the intermediate glazing pane.

13. The spacer according to claim 4, wherein the gas impermeable material comprises a metal.

14. The insulating glazing unit according to claim 8, wherein the spacer comprises at least one elastic body in the groove configured to maintain the electrical connection between the photovoltaic device and the at least two electrically conductive portions during movements of the intermediate glazing pane.

15. The insulating glazing unit according to claim 14, wherein the at least one elastic body comprises a spring.

16. The insulating glazing unit according to claim 10, wherein the spacer comprises at least one elastic body in the groove configured to maintain the electrical connection between the one or plural photovoltaic device and the at least two electrically conductive portions during movements of the intermediate glazing pane.

17. The insulating glazing unit according to claim 16, wherein the at least one elastic body comprises a spring.

18. The spacer according to claim 1, wherein:
the first material is a plastic material and the second material is a gas impermeable material, and
the at least two electrically conductive portions comprise a first metal sheet on or in the first side wall and a second metal sheet on or in the second side wall.

19. The spacer according to claim 1, wherein:

the first material is a plastic material and the second material is a gas impermeable material, and the at least two electrically conductive portions comprise a first body of metallic fibers in the first side wall and a second body of metallic fibers in the second side wall.

20. The spacer according to claim 1, wherein:

the first material is a plastic material and the second material is a gas impermeable material, and the first electrically conductive portion is electrically connected to a first portion of the gas barrier and the second electrically conductive portion is electrically connected to a second portion of the gas barrier, the first portion of the gas barrier being electrically isolated from the second portion of the gas barrier.

* * * * *